(12) United States Patent
Cahill et al.

(10) Patent No.: US 9,688,389 B2
(45) Date of Patent: Jun. 27, 2017

(54) SYSTEMS AND METHODS FOR LANDING IDENTIFICATION

(75) Inventors: Eric D. Cahill, Troy, OH (US); Michael Shaw, Gilbert, AZ (US)

(73) Assignee: Goodrich Corporation, Charlotte, NC (US)

(*) Notice: Subject to any disclaimer, the term of this patent is extended or adjusted under 35 U.S.C. 154(b) by 1337 days.

(21) Appl. No.: 13/312,495

(22) Filed: Dec. 6, 2011

(65) Prior Publication Data
US 2013/0139590 A1 Jun. 6, 2013

Related U.S. Application Data

(63) Continuation of application No. 13/312,073, filed on Dec. 6, 2011.

(51) Int. Cl.
*B64C 25/00* (2006.01)
*B64C 25/46* (2006.01)

(52) U.S. Cl.
CPC .............. *B64C 25/00* (2013.01); *B64C 25/46* (2013.01)

(58) Field of Classification Search
CPC .......... G06F 17/18; B64C 25/36; B64C 25/46
See application file for complete search history.

(56) References Cited

U.S. PATENT DOCUMENTS

| | | | |
|---|---|---|---|
| 4,021,647 A | 5/1977 | Meier | |
| 4,409,664 A * | 10/1983 | Skarvada | B60T 8/172 303/168 |
| 4,519,559 A | 5/1985 | Logan et al. | |
| 4,986,610 A | 1/1991 | Beck et al. | |
| 5,406,485 A * | 4/1995 | Wise | B60T 8/885 303/122.05 |
| 5,913,911 A | 6/1999 | Beck et al. | |
| 6,148,055 A | 11/2000 | Sakai | |
| 2010/0281967 A1 | 11/2010 | Cahill | |
| 2013/0139590 A1 | 6/2013 | Cahill et al. | |

FOREIGN PATENT DOCUMENTS

JP           04197892           7/1992

OTHER PUBLICATIONS

Final Office Action dated Sep. 10, 2015 in U.S. Appl. No. 13/312,073.

(Continued)

*Primary Examiner* — Manuel Rivera Vargas
(74) *Attorney, Agent, or Firm* — Snell & Wilmer L.L.P.

(57) ABSTRACT

Systems and methods disclosed herein may be useful for use in landing identification. In this regard, a method is provided comprising receiving pulse information over a first time period, wherein the pulse information is indicative of an angular distance traveled by a first wheel, comparing the pulse information to a threshold value, and determining a likelihood of a landing event based upon the comparison. In various embodiments, a system is provided comprising a monstable multivibrator in electrical communication with a metal-oxide-semiconductor field-effect transistor (MOSFET), a resistor-capacitor network in electrical communication with the MOSFET, and a comparator that receives a voltage from the resistor-capacitor network and a reference voltage.

6 Claims, 4 Drawing Sheets

(56) References Cited

OTHER PUBLICATIONS

Final Office Action dated Oct. 6, 2014 in U.S. Appl. No. 13/312,073.
Office Action dated Jan. 29, 2015 in U.S. Appl. No. 13/312,073.
Office Action dated Apr. 11, 2014 in U.S. Appl. No. 13/312,073.
Extended European Search Report dated Apr. 25, 2013 in European Application No. 12185283.4.
Communication Pursuant to Article 94(3) EPC dated Feb. 1, 2016 in European Application No. 12185283.4.

* cited by examiner

US 9,688,389 B2

SYSTEMS AND METHODS FOR LANDING IDENTIFICATION

CROSS REFERENCE TO RELATED APPLICATIONS

This application is a continuation of U.S. application Ser. No. 13/312,073, filed, Dec. 6, 2011 and entitled, "Systems And Methods For Landing Identification." The '073 Application is hereby incorporated by reference in its entirety.

FIELD

The present disclosure is related to systems and methods for landing identification for use in, for example, an aircraft.

BACKGROUND

It is useful for aircraft systems to identify or otherwise determine when a landing event is occurring. Many conventional aircraft identify a landing event by using signals from the landing systems, such as weight on wheels (WOW) or landing gear down lock. Thus, if the landing systems fail, a landing event may go unidentified, and aircraft systems that perform certain functions during landing may exhibit suboptimal performance. Thus, there is a need for other aircraft systems to be capable of identifying a landing event. For example, it would be useful for an aircraft braking system to determine a landing event.

SUMMARY

Systems and methods disclosed herein may be useful for use in landing identification. In this regard, a method is provided comprising receiving pulse information over a first time period, wherein the pulse information is indicative of an angular distance traveled by a first wheel, comparing the pulse information to a threshold value, and determining a likelihood of a landing event based upon the comparison.

In various embodiments, a system is provided comprising a timer in electrical communication with a counter, wherein the timer provides a first time period to the counter, wherein the counter stores received pulse information, a comparator in electrical communication with the counter, wherein the comparator is configured to compare the received pulse information with a stored value.

In various embodiments, a system is provided comprising a monstable multivibrator in electrical communication with a metal-oxide-semiconductor field-effect transistor (MOSFET), a resistor-capacitor network in electrical communication with the MOSFET, and a comparator that receives a voltage from the resistor-capacitor network and a reference voltage.

In various embodiments, a method is provided comprising triggering a monstable multivibrator in response to a conditioned wheel angular displacement signal, sinking current, using a MOSFET, in response to the triggering, creating an average voltage at a node from pulsed voltage at a drain of the MOSFET, and comparing, using a comparator, the average voltage to a reference voltage.

In various embodiments, a landing detection system is provided comprising a wheel speed sensor that outputs a signal indicative of angular displacement, a signal conditioner that receives the signal indicative of angular displacement and outputs a conditioned angular displacement signal, a monstable multivibrator that receives the conditioned angular displacement signal, wherein the monstable multivibrator is in electrical communication with a wheel angular displacement circuit, wherein the wheel angular displacement circuit changes state in response to angular displacement above a displacement threshold over a first time period.

BRIEF DESCRIPTION OF THE DRAWINGS

Various embodiments are particularly pointed out and distinctly claimed in the concluding portion of the specification. Below is a summary of the drawing figures, wherein like numerals denote like elements and wherein:

DETAILED DESCRIPTION

Figure 1:
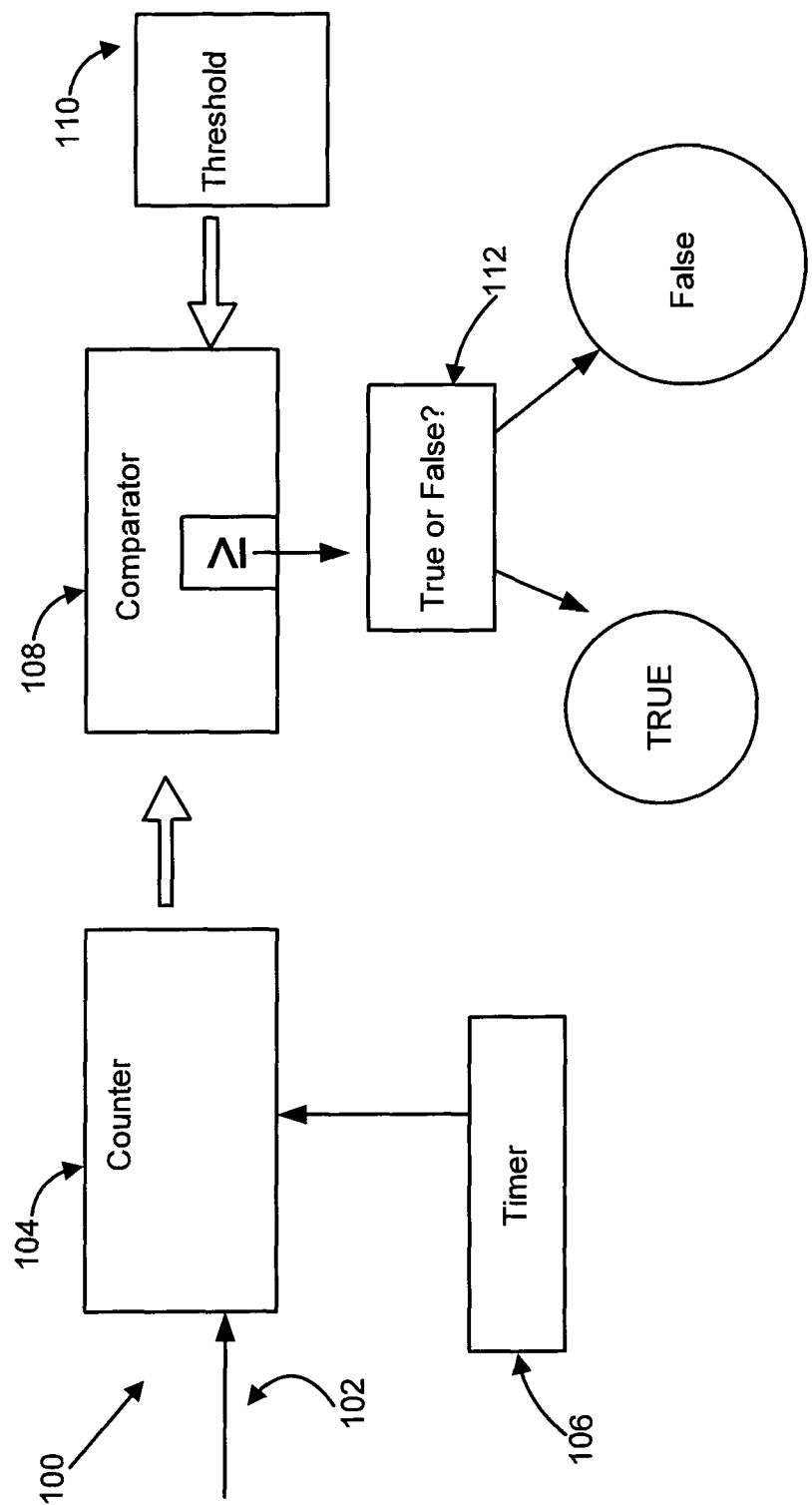
FIG. 1 illustrates a landing identification system in accordance with various embodiments.

The detailed description of exemplary embodiments herein makes reference to the accompanying drawings, which show exemplary embodiments by way of illustration and its best mode. While these exemplary embodiments are described in sufficient detail to enable those skilled in the art to practice the inventions, it should be understood that other embodiments may be realized and that logical, chemical and mechanical changes may be made without departing from the spirit and scope of the inventions. Thus, the detailed description herein is presented for purposes of illustration only and not of limitation. For example, the steps recited in any of the method or process descriptions may be executed in any order and are not necessarily limited to the order presented. Moreover, many of the functions or steps may be outsourced to or performed by one or more third parties. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

Systems and methods disclosed may be useful for landing identification systems. Although the embodiments are described with reference to landing identification systems used in connection with aircraft, such embodiments are provided for example only as it is contemplated that the disclosures herein have applicability to other vehicles, such as for example, automobiles.

Landing identification systems that rely on wheels and/or brakes may provide redundancy and robustness to an aircraft's landing system-based landing identification system. By sourcing a landing identification system in an aircraft component apart from the landing system, there is less probability of a total system failure which, in this case, would be the failure to detect a landing. The output of landing identification systems may be forwarded to any aircraft component and is especially useful to aircraft components that perform various functions or change their functionality during a landing event.

Accordingly, in various embodiments, a landing identification system may be used to measure angular displacement of a wheel over time to determine wheel velocity. This value may then be compared to a known value, below which it is known that landing is unlikely. If the value is higher, a voting scheme may be used amongst one or more wheels to determine whether a landing event is occurring or if some other error condition is occurring. Multiple iterations may be used to verify a landing event and reduce the effect of transient anomalies and/or signal noise.

An aircraft may comprise one or more types of aircraft wheel and brake assemblies. For example, an aircraft may have four wheels. Two wheels may be on the left side of the plane and two wheels may be on the right side of an aircraft. The left side wheels may be referred to as "left outboard" (LO) and "left inboard" (LI). The right side wheels may be referred to as "right outboard" (RO) and "right inboard" (RI). Each wheel may have its own brake assembly. The systems and methods disclosed here may be useful in aircraft having any number of wheels.

Aircraft wheels and brake assemblies may include one or more wheel speed sensors. A wheel speed sensor may sense the speed, acceleration, and/or angular displacement of a wheel. As one should understand, the knowledge of angular displacement over time allows one to calculate wheel speed (the scalar of angular velocity) and the knowledge of wheel speed over time allows one to calculate acceleration of a wheel. A wheel speed sensor may be of any type, such as a Hall Effect sensor or a variable reluctance sensor.

A wheel speed sensor may output a DC voltage or an AC voltage. A wheel speed sensor may also output a signal at a given frequency. For example, in various embodiments, a wheel speed sensor outputs a signal at from about 1 kHz to about 6 kHz, and more preferably at about 3 kHz. The output of a wheel speed sensor may be indicative of angular displacement of a wheel. Stated another way, the output of a wheel speed sensor may correspond with a particular angular wheel position.

Figure 2:
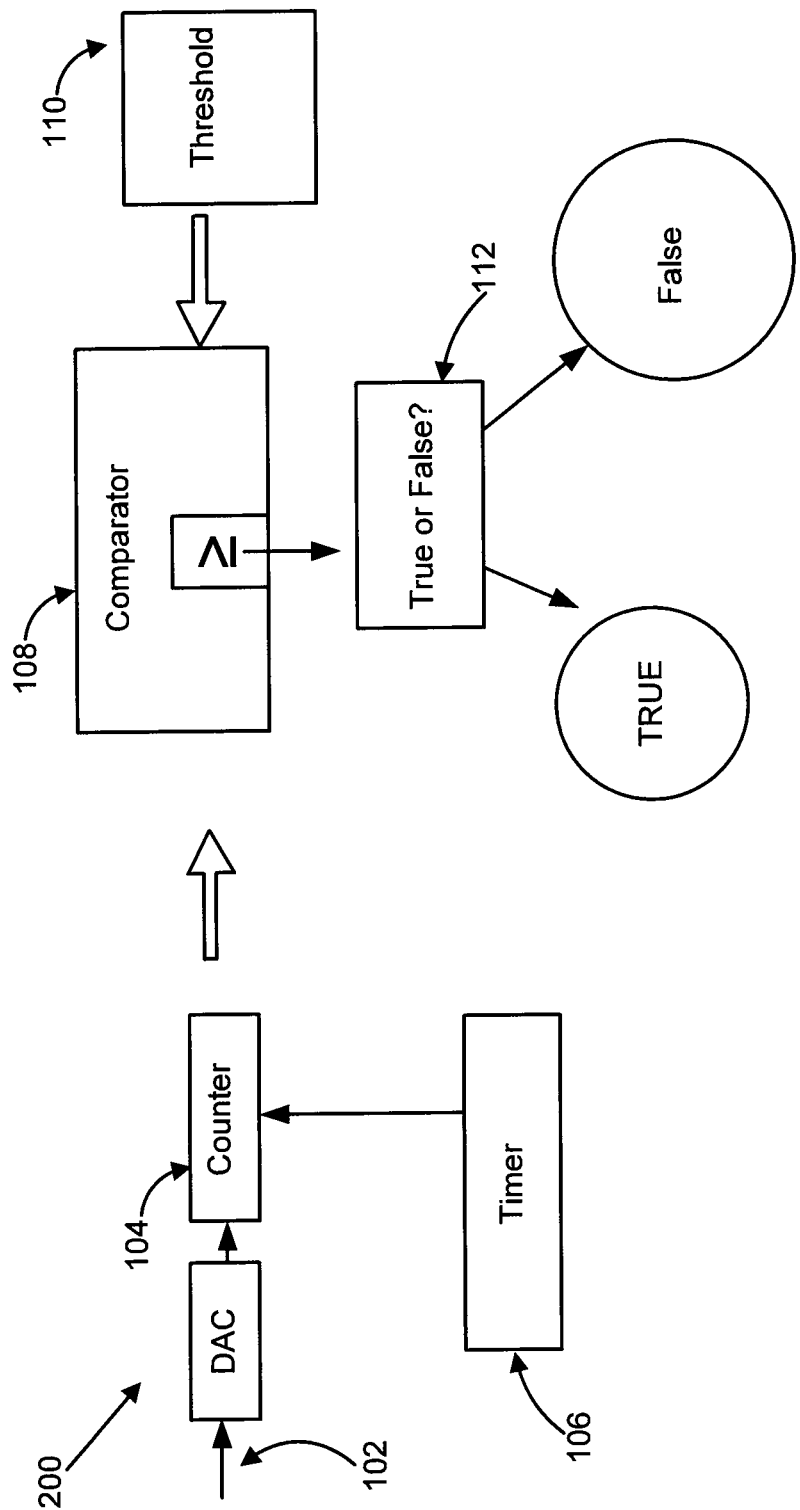
FIG. 2 illustrates the landing identification system of FIG. 1 and including a digital to analog converter, in accordance with various embodiments.

With reference to FIG. 1, landing identification system 100 is shown. Angular displacement 102 may be received by counter 104. Angular displacement may optionally be conditioned prior to receipt by counter 104. For example, with momentary reference to FIG. 2, angular displacement 102 is conditioned by digital to analog convertor (DAC) 202. With reference back to FIG. 1, angular displacement may be conditioned by any suitable means. Conditioning a signal may include any alteration or modification of the signal, such as converting to a square wave, digital conversion, or the like. Angular displacement 102, whether conditioned or unconditioned, may be referred to as "pulse information" herein.

Counter 104 receives and stores (i.e., counts or sums) the angular displacement 102. Counter 104 may count any representation of angular displacement. Counter 104 may count peaks of a sine wave of angular displacement 102, zero crossings of a sine wave of angular displacement 102, bits of data from a digitally converted angular displacement 102, or other suitable representation of angular displacement 102.

Timer 106 sets a period within which counter 104 counts. Timer 106 thus triggers the beginning of storage of information by counter 104 and then, at the end of the period, triggers a purge of counter 104 so that a new period may begin. In various embodiments, timer 106 is a 555 timer. The period that timer 106 sets may be of any suitable duration. In various embodiments, the duration of the period is large enough to lessen the tendency for a "false positive" due to noise or a transient angular displacement but short enough to identify a landing event quickly. For example, in various embodiments, a period may be about 50 ms to about 500 ms, more preferably, about 100 ms to about 350 ms and further preferably between 200 ms and 300 ms.

In various embodiments, and in response to the end of a period and/or prior to any purging of counter 104, counter 104 passes at least a portion of the information stored during the period to comparator 108. In various embodiments, a counter (e.g., counter 104) passes a numerical value to a comparator, where the numerical value may be, for example, a real number such as an integer. Counter 104 may pass information indicative of the angular displacement 102 received during the period. For example, where angular displacement 102 is digital, counter 104 may sum the digital input for passing to comparator 108. For example, where angular displacement 102 represents zero crossings, counter 104 may sum the zero crossings for passing to comparator 108. Where counter 104 outputs an analog signal, such as a voltage, counter 104 may pass a voltage to a comparator.

Comparator 108 is a digital comparator, though analog comparators may be used in various embodiments. Comparator 108 compares the value provided by counter 104 with the threshold 110. Comparator 108 outputs a first value when the output of counter 104 is less than the threshold 110 and outputs a second value when the output of counter 104 is greater than or equal to the threshold 110. It should be noted that comparator 108 may be configured to execute any one of logical operations comprising: "greater than," "equal to," "less than," "greater than or equal to," and "less than or equal to." Comparator 108 outputs true/false value 112. Comparator 108 is configured to output TRUE in response to the value provided by counter 104 being greater than or equal to the threshold 110 and to output FALSE in response to the value provided by counter 104 being less than threshold 110.

Threshold 110 may be set at any suitable value. Threshold 110 may be selected in accordance with the selected period. Knowledge of an amount of angular displacement along with the time period of the angular displacement is representative of angular velocity. Thus, threshold 110 may be selected so that a comparator will output a given value in response to the angular velocity exceeding a particular value. For example, a wheel speed sensor may output a sinusoidal wave form that crosses the x axis (i.e., when the y axis equals 0) every time the wheel moves one half a degree. A counter may receive two zero crossings in a period of, for example, 200 ms. Thus, the wheel has moved 1 degree in 200 ms, and the angular velocity may be obtained by dividing the angular displacement over time. The threshold may then be selected to be in the range of an angular velocity associated with landing. It should be understood that various "bumps" or vibrations may cause a wheel to rotate, but not at an angular velocity or angular acceleration that also occurs during landing. An aircraft may be designed to land (i.e., touch wheels to the ground) at different speeds, depending on its other characteristics, its intended purposes, environmental conditions, and the like. Thus, landing may be associated with aircraft speeds of 300 miles per hour and below, and more typically aircraft speeds of less than 200 miles per hour, various conditions may necessitate landing at much lower or higher speeds.

In response to comparator 108 outputting a FALSE, no action may be taken. In response to comparator 108 outputting a TRUE, a landing event may be identified or it may be determined that a landing event is more likely. However, in various embodiments, a second period may elapse and an additional comparison may be performed. If another TRUE value is received, a landing event may be identified or it may be determined that a landing event is more likely. Thus, the likelihood of a landing event may be determined in response to the output of comparator 108 and/or in response to the output of a voting scheme, as described below.

Figure 3:
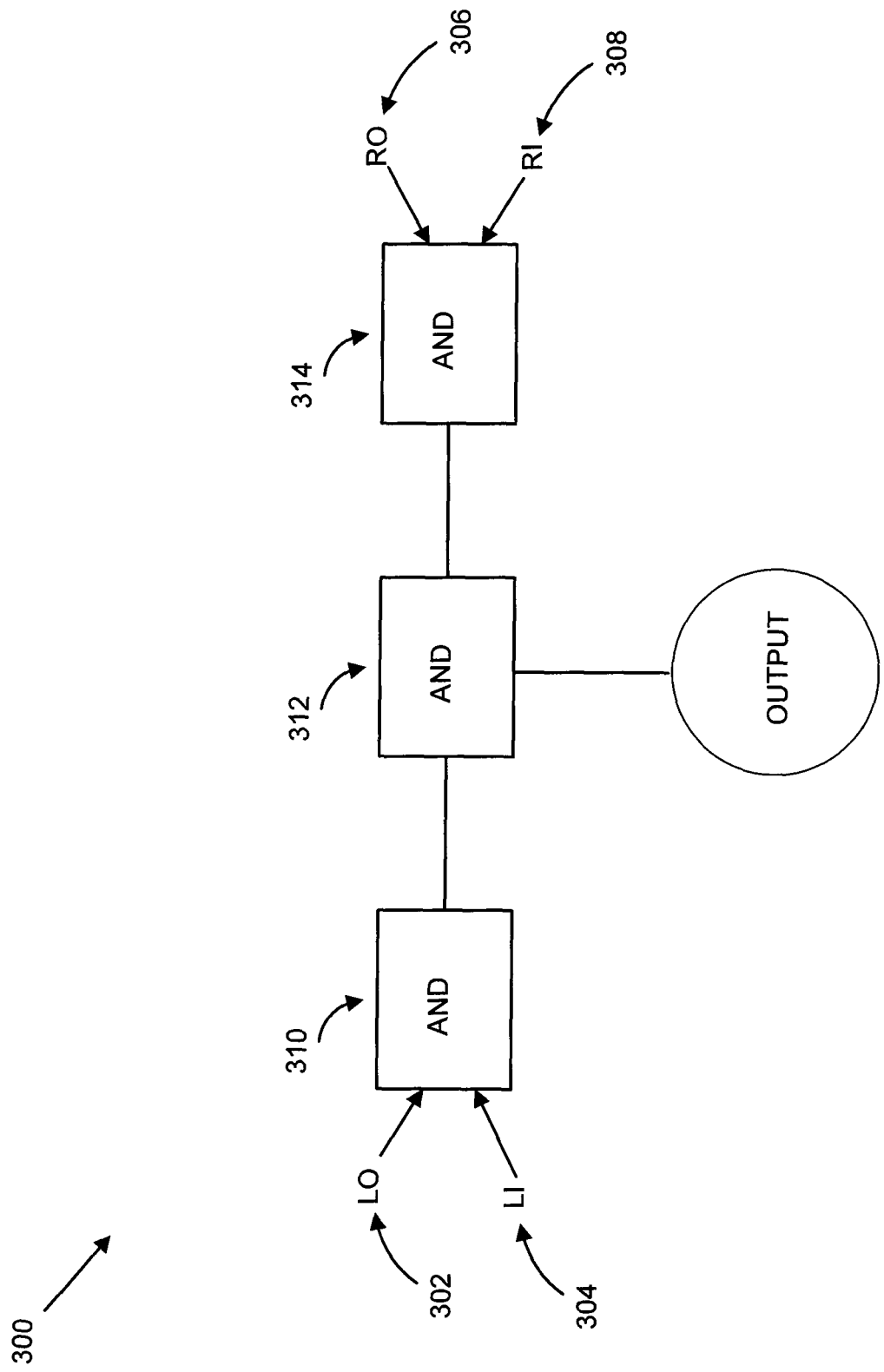
FIG. 3 illustrates a voting scheme in accordance with various embodiments.

With reference to FIG. 3, a comparator (e.g., comparator 108 of FIG. 1) may output to a voting scheme. As described above, an aircraft may have four wheels, the LO, LI, RO, and RI. To improve the accuracy of a determination of the likelihood of a landing event, a voting scheme may be used to determine if more than one wheel is experiencing a given angular velocity and/or angular acceleration. If only one wheel is experiencing an angular velocity associated with a landing event, then a false positive may be implicated and corrective action may need to take place. If multiple wheels are experiencing an angular velocity associated with a landing event, then a landing event is more likely, and if all wheels are experiencing an angular velocity associated with a landing event, then a landing event is more likely still.

Voting scheme 300 includes inputs LO 302, LI 304, RO 306, and RI 308. Each input LO 302, LI 304, RO 306, and RI 308 may be produced by components such as those shown in FIGS. 1 and 2. Stated another way, inputs LO 302, LI 304, RO 306, and RI 308 comprise TRUE or FALSE values that are indicative of an angular velocity above a threshold amount.

LO 302 and LO 304 are in electrical communication with AND gate 310. AND gate 310 is configured to output TRUE when LO 302 and LO 304 are both TRUE. RO 306 and RO 308 are in electrical communication with AND gate 314. AND gate 314 is configured to output TRUE when RO 306 and RO 308 are both TRUE.

AND gate 310 and AND gate 314 are in electrical communication with AND gate 312. AND gate 312 is configured to output TRUE when both AND gate 310 and AND gate 314 are true. Other aircraft components may note that in response to AND gate 312 being true, a landing event is occurring and, conversely, aircraft components may note that in response to AND gate 312 being false, a landing event is not occurring. Thus, voting scheme 300 illustrates an embodiment where four wheels must observe a sufficient angular velocity before a landing event is identified. In various embodiments, only one or more wheels would be needed to indicate a landing event. For example, if AND gate 310 and AND gate 314 were replaced with OR gates, only one wheel on each side of the aircraft would need to observe a landing event for AND gate 310 to output TRUE. Any other implementation may be used to select which wheel and how many wheels must observe a landing event in order for the system to indicate a landing event.

Landing detection systems may also be implemented in a circuit comprising at least one of a monostable mulivibrator, a reference voltage, MOSFET and a resistor-capacitor network. Such circuits may provide a reduced tendency for false positives due to its ability to disregard signal noise and/or transient movement of the wheel.

Figure 4:
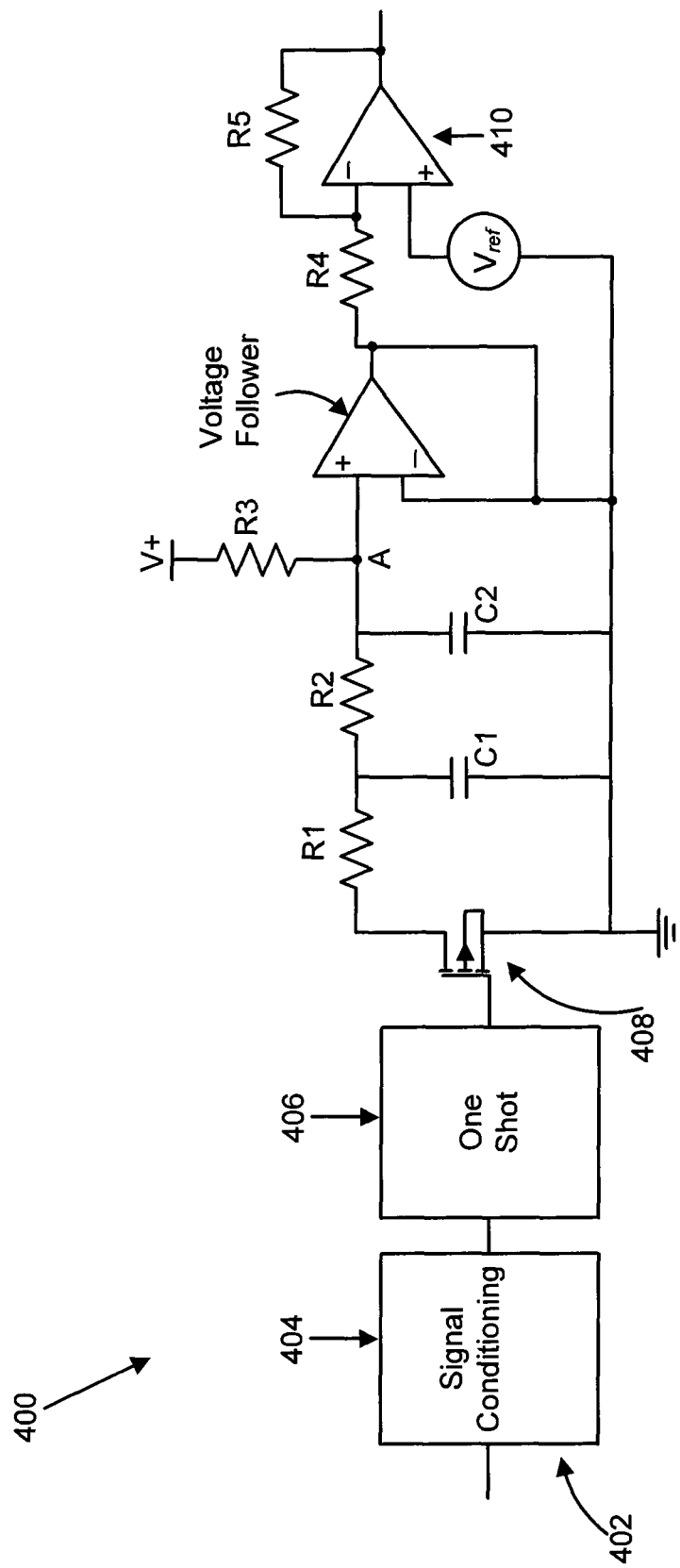
FIG. 4 illustrates a further landing identification system in accordance with various embodiments.

With reference to FIG. 4, landing detection system 400 is shown. Angular displacement signal 402 is input into signal conditioner 404. Signal conditioner 404 may comprise any signal conditioning step and/or no conditioning at all. For example, signal conditioner 404 may condition a sinusoidal wave form into a square waveform. Signal conditioner 404 may rectify an AC signal into a DC signal. Signal conditioner 404 may output a conditioned signal.

One shot 406 is a monostable multivibrator. A monostable multivibrator may be used to set a time period in response to a triggering event. In various embodiments, the conditioned signal from signal conditioner 404 may be used as a triggering event. For example, the rising or falling edge of the conditioned signal from signal conditioner 404 may be used as a triggering event. In that regard, one shot 406 begins a period upon a fixed conditioned signal.

In various embodiments, a one shot may be in electrical communication with a wheel angular displacement circuit. A wheel angular displacement circuit may comprise one or more components that may evaluate the conditioned signal from signal conditioner 404 and change output state in accordance with the conditioned signal from signal conditioner 404. For example, a wheel angular displacement circuit may be configured to evaluate a conditioned signal against a reference voltage, for example, and the wheel angular displacement circuit's may change output state based upon the evaluation. In various embodiments, a wheel angular displacement circuit may evaluate a conditioned signal against a reference voltage and change output voltage in accordance with the evaluation.

With reference back to FIG. 4, a wheel angular displacement circuit is illustrated comprising, among other components, MOSFET 408, the illustrated voltage follower, comparator 410, and a resistor-capacitor network.

MOSFET 408 is a metal-oxide-semiconductor field-effect transistor, though other transistors that provide the same or similar functionality are contemplated herein. The triggering of one shot 406 turns on MOSFET 408, which sinks current for the duration or part of the duration of the period of one shot 406.

A resistor-capacitor network is shown comprising R1, R2, C1 and C2. The resistor-capacitor network is configured to create an average voltage at node A from the pulsed voltage at the drain of the MOSFET 408. Other configurations of R1, R2, C1 and C2 are contemplated herein, including the addition of other components.

The voltage follower may be in electrical communication with the resistor-capacitor network. The voltage follower may create a buffer to isolate the comparator 410. R4 and R5 are in electrical communication with the voltage follower. R4 is connected to the negative terminal of comparator 410 and R5 is wired in series with R4 as illustrated. R4 and R5 provide hysteresis functionality to comparator 410. In various embodiments, however, comparator 410 may be selected to have adequate internal hysteresis and, thus, the voltage follower and R4 and R5 may be omitted.

As the input frequency increases, the duty cycle of MOSFET 408 increases, which in turn causes the average voltage at node A to decrease. When the frequency crosses a desired threshold, the duty cycle of MOSFET 408 may be sufficient to pull the input voltage to comparator 410 below the reference voltage ($V_{ref}$). Comparator 410 will then change outputs, indicating that the threshold of $V_{ref}$ has been exceeded. In that regard, the threshold may be controlled by the pulse width of one shot 406, $V_{ref}$, and the selection of V+.

Voting schemes, such voting scheme 300 of FIG. 3, may be used in connection with embodiments such as that described in FIG. 4.

Systems, methods and computer program products are provided. In the detailed description herein, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. After reading the description, it will be apparent to one skilled in the relevant art(s) how to implement the disclosure in alternative embodiments.

Benefits, other advantages, and solutions to problems have been described herein with regard to specific embodiments. However, the benefits, advantages, solutions to problems, and any elements that may cause any benefit, advantage, or solution to occur or become more pronounced are not to be construed as critical, required, or essential features or elements of the inventions. The scope of the inventions is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A landing identification system comprising:
   a wheel speed sensor that outputs a signal indicative of angular displacement;
   a signal conditioner that receives the signal indicative of angular displacement and outputs a conditioned angular displacement signal;
   a monostable multivibrator that receives the conditioned angular displacement signal,
   wherein the monostable multivibrator is in electrical communication with a wheel angular displacement circuit,
   a comparator in electrical communication with the wheel angular displacement circuit and configured to receive a reference voltage,
   wherein the monostable multivibrator is configured to set a time period in response to receiving the conditioned angular displacement signal,
   wherein the wheel angular displacement circuit changes state in response to angular displacement above a displacement threshold over a first time period,
   wherein the comparator compares the reference voltage to a voltage output of the wheel angular displacement circuit, and
   wherein a voting scheme determines a likelihood of a landing event based upon the comparison.

2. The landing identification system of claim 1, wherein the displacement threshold is indicative of a speed over 20 knots.

3. The landing identification system of claim 1, wherein the change of state of the wheel angular displacement circuit is provided to another aircraft component.

4. The landing identification system of claim 1, wherein the period is between 50 ms and 500 ms.

5. The landing identification system of claim 1, wherein the wheel speed sensor is a variable reluctance wheel speed sensor.

6. The landing identification system of claim 1, wherein the signal indicative of angular displacement is in AC form.

* * * * *